(12) United States Patent
Morales et al.

(10) Patent No.: US 6,477,225 B1
(45) Date of Patent: Nov. 5, 2002

(54) X-RAY MASK AND METHOD FOR PROVIDING SAME

(75) Inventors: Alfredo M. Morales, Pleasanton, CA (US); Dawn M. Skala, Fremont, CA (US)

(73) Assignee: Sandia National Laboratories, Livermore, CA (US)

( * ) Notice: Subject to any disclaimer, the term of this patent is extended or adjusted under 35 U.S.C. 154(b) by 0 days.

(21) Appl. No.: 09/636,002

(22) Filed: Aug. 9, 2000

(51) Int. Cl.[7] .................................................. G21K 5/00
(52) U.S. Cl. ........................................... 378/35; 378/34
(58) Field of Search ............................... 378/34, 35, 36

(56) References Cited

U.S. PATENT DOCUMENTS

| | | | | |
|---|---|---|---|---|
| 5,751,780 A | * | 5/1998 | Fukuda et al. ................. | 378/34 |
| 5,902,706 A | * | 5/1999 | Huh ............................. | 378/35 |
| 6,317,480 B1 | * | 11/2001 | Shoki et al. .................... | 378/34 |

OTHER PUBLICATIONS

Becker, E.W.; Ehrfeld, W.; Hagmann, P.; Maner, A.; Muenchmeyer, D.; "Fabrication of microstructures with high aspect ratios and great structural heights by synchrotron radiation lithography, galvanoforming, and plastic moulding (LIGA process)," *Microelectronic Engineering*, vol. 4 (1986) pp. 35–56 Published by Elsevier Scientific Publishers B.V.

Ehrfeld, W.; Glashauser, W.; Muenchmeyer, D.; Schelb, W.; "Mask making for synchrotron radiation light," *Microelectronic Engineering*, vol. 5 (1986) pp. 463–470 Published by Elsevier Scientific Publishers B.V.

Ehrfeld, W.; Lehr, H.; "Deep x–ray lithography for the production of three–dimensional microstructures from metals, polymers, and ceramics," *Radiat. Phys. Chem.*, vol. 45 No. 3 (1995) pp. 349–365 Published by Pergamon Press, Elsevier Scientific Ltd.

Bhardwaj, J.K.; Ashraf, H.; "Advanced silicon etching using high density plasmas" *Proceedings of SPIE* vol. 2639 (1996) pp. 224–233 Published by SPIE—The International Society for Optical Engineering.

(List continued on next page.)

*Primary Examiner*—Robert H. Kim
*Assistant Examiner*—Hoon K. Song
(74) *Attorney, Agent, or Firm*—Timothy P. Evans

(57) ABSTRACT

The present invention describes a method for fabricating an x-ray mask tool which can achieve pattern features having lateral dimension of less than 1 micron. The process uses a thin photoresist and a standard lithographic mask to transfer an trace image pattern in the surface of a silicon wafer by exposing and developing the resist. The exposed portion of the silicon substrate is then anisotropically etched to provide an etched image of the trace image pattern consisting of a series of channels in the silicon having a high depth-to-width aspect ratio. These channels are then filled by depositing a metal such as gold to provide an inverse image of the trace image and thereby providing a robust x-ray mask tool.

12 Claims, 5 Drawing Sheets

OTHER PUBLICATIONS

Ajmera, P.K.; Stadler, S.; Abdollahi, N.; "Development of a low-cost X-ray mask for high-aspect ratio MEM smart structures" *Proceedings of SPIE* vol. 3328 (1998) pp. 14-22 Published by SPIE—The International Society for Optical Engineering.

Shew, B.-Y.; Cheng, Y.; Shih, W.-P.; Lu, M.; Lee, W.H.; "High percision, low cost mask for deep x-ray lithography" *Microsystems Technology*, vol. 4 (1998) pp. 66-69 Published by Springer-Verlag.

Klein, J.; Guckel, D.P.; Siddons, D.J.; Johnson, E.D.; "X-ray masks for very deep X-rGy lithography" *Microsystems Technology*, vol. 4 (1998) pp. 70-73 Published by Springer-Verlag.

Sheu, J.T.; Chiang, S.; Su, S.; "Fabrication of intermediate mask for deep x-ray lithography" *Microsystems Technology*, vol. 4 (1998) pp. 74-76 Published by Springer-Verlag.

Chen, D.; Zhang, D.; Ding, G.; Zhao, X.; Zhang, J.; Yang, C.; Cai, B.; "DEM technique: A new three-dimensional micro fabrication technique for non-silicon materials" *Proceedings of SPIE* vol. 3680 No. 2 (1999) pp. 1099-1104 Published by SPIE—The International Society for Optical Engineering.

Harris, C.; Desta, Y.; Kelly, K.W.; Calderon, G.; "Inexpensive, quickly producable X-ray mask for LIGA" *Microsystems Technology*, vol. 5 (1999) pp. 189-195 Published by Springer-Verlag.

Coane, P.; Giasolli, R.; Ledger, S.; Lain, K.; Ling, Z.; Goettert, J.; "Fabrication of HARM structures by deep X-ray lithography using graphite mask technology" *Microsystems Technology*, vol. 6 (2000) pp. 94-98 Published by Springer-Verlag.

\* cited by examiner

X-RAY MASK AND METHOD FOR PROVIDING SAME

The United States Government has rights in this invention pursuant to Contract No. DE-AC04-94AL85000 between the United States Department of Energy and Sandia Corporation, for the operation of the Sandia National Laboratories.

BACKGROUND OF THE INVENTION

1. Field of the Invention

The present invention relates to contact lithographic masks having submicron features, and to a method for producing such masks. These tools are useful in the preparation of plating molds for fabricating metal microparts and are particularly useful for providing molds having lateral feature dimensions on the order of tenths to hundredths of microns while also having feature depth dimensions on the order of ten to hundred times those dimensions.

2. Description of Related Art

A variety of methods are presently known for making microparts. U.S. Pat. No. 5,256,360 to Li, teaches the use of a precisely controlled micro-electrode discharge machine (EDM) to make the micro-filter mold and suggests the use of laser-beam micro-machining, or electron-beam micro-machining, as suitable alternative processes. However, Li ('360), also teaches that molds made using conventional integrated circuits (IC) processing and lithographic processes in silicon tend to incorporate high internal strain, are prone to damage, are expensive to produce, and thus not economical to manufacture.

U.S. Pat. No. 5,501,893 to Laermer, et al. describes a lithographic technique for etching silicon, generally referred to as "anisotropic etching," where it is possible to achieve deeply-extending trenches while simultaneously providing side walls which are as nearly parallel and vertical as desired. In order to achieve these geometries it is necessary to allow etching to progress only on the bottom of the etched trench in the silicon substrate and not on the walls of the trench. In particular, Laermer ('893) teaches a two stage process for alternately etching an exposed silicon surface in a reactive ion plasma followed by coating the etched surfaces with a thin polymerized layer, wherein the polymer coating serves to protect the wall surfaces of the trench from action of the plasma since these surfaces are not directly face the incoming flux of plasma ions. However, the polymer layer applied to the "floor" surface of the trench quickly breaks down in the presence of the ion bombardment since this surface directly faces the incoming ions. The polymer layer, therefore, forms a very effective etching "stop" on those edges or surfaces not directly in the path of the ion flux allowing for directional etching.

The process continues in this manner, alternating etching steps with coating steps, until the predetermined etching depth of the structures in the silicon substrate is reached.

SUMMARY OF THE INVENTION

Therefore, it is an object of the present invention to provide a process for fabricating highly accurate, three dimensional x-ray masking tools.

It is another object to provide an x-ray mask comprising a silicon substrate having a foil-like metal pattern embedded into the thickness of the substrate.

Yet another object of the invention is to provide an x-ray mask having an embedded metal pattern whose thickness is sufficient to attenuate virtually all x-ray radiation having an energy at or below 10 KeV which strikes the pattern in a direction parallel to the metal thickness.

It is another object of the invention to provide an x-ray mask wherein the embedded pattern comprises a plurality of structural elements exhibiting features having lateral dimensions of much less than 1 micron.

Still another object of the invention is to provide an x-ray mask wherein the features include both the structural elements comprising the pattern, and the separation distances between those elements.

Yet another object of the invention is to provide an embedded pattern having features exhibiting a height-to-width aspect ratio of greater than about 30-to -1.

Another object of the invention is to provide a robust x-ray mask tool which is capable of withstanding repeated handling and very long exposure to high-dose x-ray radiation.

DETAILED DESCRIPTION OF THE INVENTION

Figure 1A:
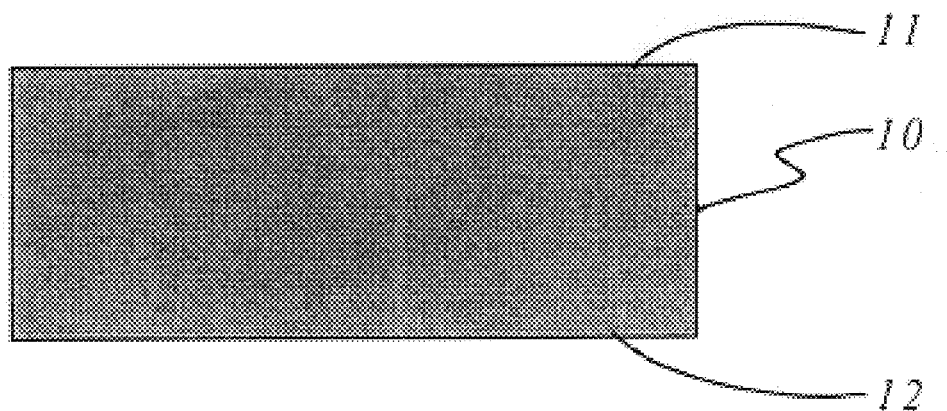
FIG. 1A shows the first step in an embodiment of the present method wherein a silicon substrate wafer, or the like, is provided.

The present invention provides a process for fabricating a robust x-ray mask tool. In particular, the present invention provides a process for fabricating an x-ray mask tool capable of replicating features having lateral dimension of less then 1 micron. Such a mask has great utility for production of metal and ceramic microparts by the well-known LIGA processes since current technology is limited to providing part molds having lateral features sizes greater then 1 micron.

Lithographic masks are available with features less then 1 micron and are fabricated typically in 1000 Å chromium supported on glass slips. However, in order for a mask to effectively stop the high energy, high fluence synchrotron radiation used to prepare molds for LIGA microparts, the image-stop layer, opaque to x-rays, would need to be several microns thick. Typically, LIGA x-ray masks have a gold image-stop layer at least 8 microns thick. Masks this thick are very difficult to produce by conventional means if this layer includes features of less than 1 micron across.

The instant invention employs a combination of processes to produce a patterned mask which overcomes this limitation. A mask pattern is replicated in a thin layer of photoresist applied to a silicon substrate, developed to expose the pattern on the surface of the silicon, the exposed areas deeply etched by a reactive plasma technique to provide a series of trenches on the silicon surface, the trenches filled by plating a metal opaque to high energy x-rays, the plated surface planarized, and the substrate thinned to provide the desired mask.

General Description

This invention describes a lithographic mask having x-ray attenuating structures embedded in an essentially x-ray transparent support media. Furthermore, the invention describes a lithographic mask having features which can have lateral dimensions much smaller than 1 micron across, whether those features are the x-ray blocking structures themselves or the separation spaces between such structures.

The process begins with a standard silicon substrate. A layer of a polymer photoresist is placed onto a top surface of substrate such that the layer is no more than 1–2 microns thick. Any technique for applying such layers may be used, including dipping, spraying, spinning or vapor depositing, and either organic or inorganic resists may be used. The method of application and composition of the resist is not critical except for the need for providing a coating layer of less than 2 microns.

The resist layer is baked, or otherwise cured, and the desired image pattern rendered onto the layer top surface by using any of a number of conventional lithographic processes, such as by a direct contact transmission mask. It is also possible to create the desired pattern by imaging the reflection of a non-contact mask through camera optics onto the resist surface, or by directly "writing" the image by using a programmable e-beam writer. Important to the proper operation of the invention is the ability of the exposing "light" used to penetrate the full depth the resist since it is known that as "light" wavelengths decrease toward the hard UV (<190 nm) their penetrating power is significantly reduced necessitating thinner resist layers. Being able to fully penetrate the resist layer will allow the user to achieve the very small lateral dimensions desired. Use of a thin resist layer and a broadband light source helps to satisfy this requirement.

Since the resist coating will act as an etchant barrier during subsequent processing, the amount of protection needed will be determined by the processing necessary to provide the desired structure. Different combinations of resist compounds provide additional options. In the present case a thin polymer resist is placed directly onto a silicon substrate, cured, masked and exposed to broadband light. Such a structure can provide about a 50-to-1 processing-protection ratio; a sufficiently robust etchant barrier to allow etching deep, narrow, channel structures in the silicon substrate. A composite resist comprising a thin layer of conventional polymer resist may be applied over a thin silicon dioxide layer grown onto the silicon substrate, where UV light is used to create the image pattern. Such resists permit direct transfer of the image into a silicon dioxide (glass) "hard" resist which provides a processing protection ratio of 200-to-1 which is about equivalent to the former resist barrier since the glass resist layer is much thinner, typically about 1000 Å.

After rendering the image of the mask into the resist, the resist layer is chemically "developed" and the exposed areas of the resist either removed or retained, depending upon the specific resist chemistry used.

Following the development of the resist, the patterned substrate is exposed to a series of anisotropic reactive etching steps such as those set forth in the so-called BOSCH process described in U.S. Pat. No. 5,501,893, herein incorporated by reference in its entirety. In this, or similar anisotropic processes, the top surface of the silicon substrate is protected by the retained resist layer. This first etching step is followed by a first polymerization step which coats the walls, edges and bases of the etched recesses in the silicon substrate. Plasma reactor parameters and etching times are adjusted and limited to avoid excessive damage to the resist layer and the process proceeds in this manner, alternating between etching and coating steps, until a etch depth of between 10 to 30 microns is achieved. In particular, in order for an mask to effectively stop the high energy synchrotron radiation used to prepare molds for LIGA microparts, a thickness of at least 8 microns of gold is necessary. Etch depths of at least this dimension are therefore critical to the success of this invention.

After etching the silicon substrate, the remaining resist is stripped away and the substrate cleaned, after which a "seed" layer of 0.025 microns of chromium followed by 0.08 microns of gold is vapor deposited onto the entire surface. Alternately, this layer may be omitted if the substrate used is a doped, highly conductive, form of silicon.

Where the more conventional undoped silicon substrate is used, a second, thicker gold layer is deposited over the "seed" layer so as to completely fill and cover the etched recesses. Coating is typically done by electroplating or by electroless deposition onto the "seed" layer but may be done by any method providing the applied layer is uniform in composition and structure and provides a continuous, condensed layer. The thick x-ray blocking layer may be laid down, for instance, by continuing the vapor deposition of the "seed" layer, by plasma spraying, or by epitaxy deposition. Time and cost, however, favor a plating process.

Once plated, the incipient mask is planarized by lapping the top surface of the substrate in order to remove the metal layers from this surface leaving the surface flat, and essentially free of the plated metal. What remains is a silicon substrate with a fine metal structure embedded into the thickness of the substrate forming an imaging pattern comprising a gold (or other similar x-ray opaque material) "ribbon" structures extending to a depth of 10 microns or more wherein the widths of the structures may be less than 1 micron is provided In a final step, the back surface of the silicon substrate, the side opposite the planarized surface, is etched away in a region underneath the plated gold pattern to a depth sufficient to reduce the total thickness of the silicon in this region to below about 100 microns. This is done because it is known that x-ray radiation at energy levels of about 10 KeV is not significantly attenuated by passing through silicon of these thicknesses.

Specific Description

An embodiment of the steps of the invention are described with reference to FIGS. 1 through 5.

As required, detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

Figure 1B:
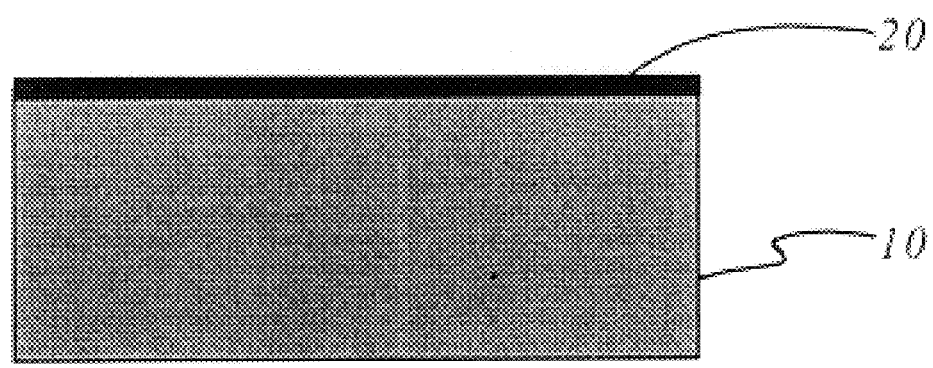
FIG. 1B illustrates the application of a photoresist film onto a top surface of the substrate wafer.

Referring to FIG. 1A, the process begins with a silicon substrate or wafer 10. This substrate can, generally, having any useful shape and thickness but should of necessity be a thin wafer having parallel top and bottom surfaces 11 and 12. In particular the present invention is most easily implemented by using an industry standard 100 mmØ×0.67 mm thick wafer. In FIG. 1B a liquid photoresist film 20 (herein SRP 3612 Novolak) is applied by spin coating to a thickness of about 1.8 microns or less, and then baked at a temperature of 95° C. for about 90 seconds in order to at least partially cure the resist layer. The particular resist thickness is chosen so as to balance the need for providing a thick enough layer to protect the unexposed portions of the silicon substrate from the effects of the later ion etch phase against the desire to fully expose the full thickness of the resist during the light exposure phase.

Figure 1C:
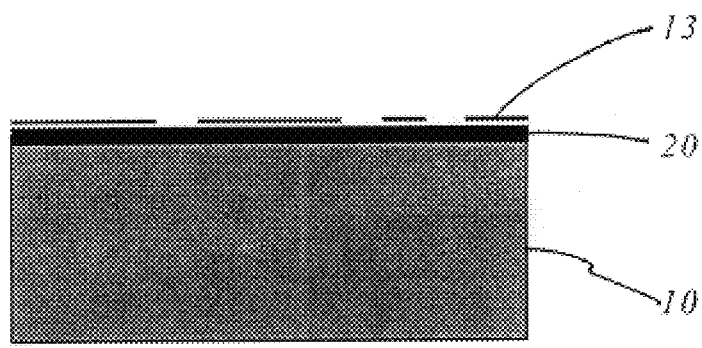
FIG. 1C shows the placement of a negative(positive) trace image of a desired pattern on the photoresist.
Figure 1D:
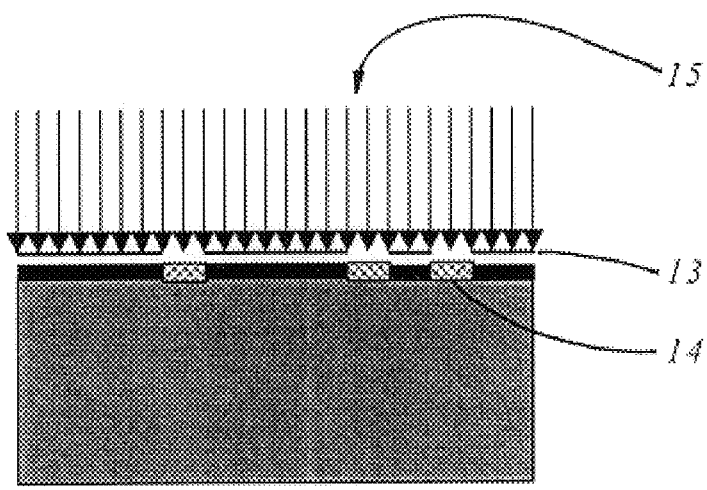
FIG. 1D a shows the exposure of the uncovered portions of the photoresist film to a source of radiation in order to transfer a positive(negative) image of the trace image into the photoresist.

In a next step, shown in FIG. 1C, a standard direct-contact lithographic mask 13, herein embodying a negative trace image of the desired pattern, is placed directly on the surface of the of resist layer 20 (FIG. 1C intentionally shows mask 13 above this surface for clarity sake only). In FIG. 1D the exposed portions 14, of the resist layer 20 are subjected to a source (not shown) of broadband light, 15. Mask 13, is itself formed by depositing a 1000Å–5000Å thick layer of chromium, or similar, into a glass support slip and comprises a plurality of lines and other structures and features, and separations between features, some of which have minimum lateral dimensions (dimensions in the plane of the mask, perpendicular to separate pattern features) of less than 1 micron. The resist exposure source used herein was a high pressure mercury-vapor lamp emitting light over a spectral range of about 365nm to 450nm and providing a dose of approximately 80 millijoules/cm$^2$ measured at a wavelength of 365 nm.

Figure 1E:
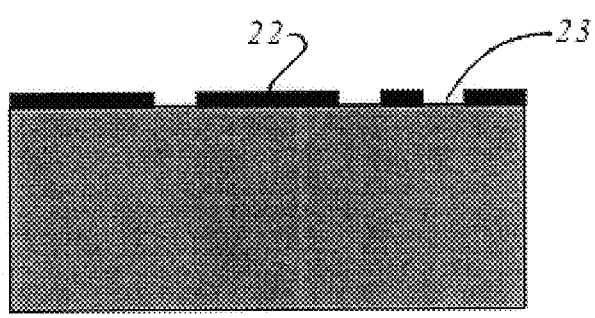
FIG. 1E shows the silicon substrate after portions of the photoresist layer are developed and removed thereby exposing portions of silicon substrate.

In the next step in the process, illustrated in FIG. 1E, the photoresist is chemically "developed" and the exposed portions, 14, of photoresist layer 20 are removed. What remains are the unexposed portions, 22, of the resist in an inverse image of the mask pattern wherein this inverse image comprises "clear" areas 23 of exposed silicon. Again, this step is performed using standard and well-known lithographic processes.

It should be noted that the choice of a positive or negative image mask depends largely on the nature of the photoresist used, i.e., depending upon whether or not the exposed portion of the photoresist is removed or left intact after the resist has been developed. Either approach is possible, although, depending on the nature of the desired pattern, one is usually more preferred than the other.

Figure 2A:
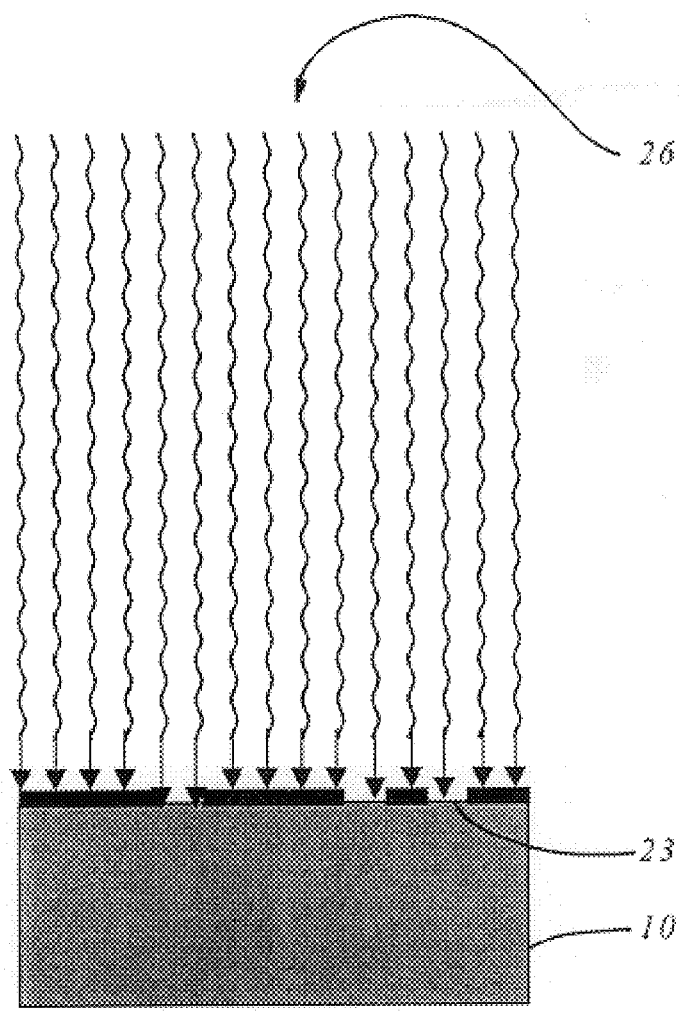
FIG. 2A illustrates the silicon substrate covered by the developed photoresist in which exposed portions of the substrate are subjected to an etching plasma.
Figure 2B:
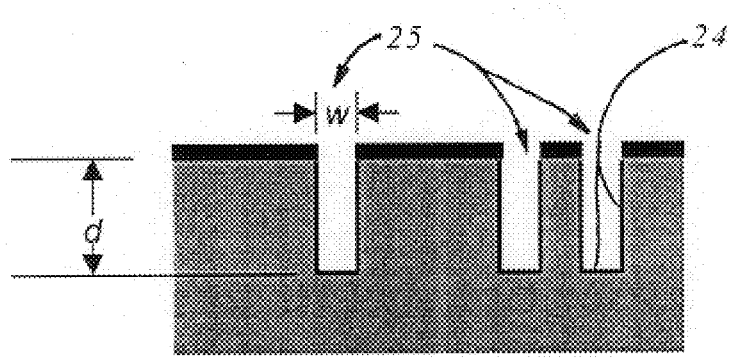
FIG. 2B illustrates the silicon substrate covered by the developed photoresist after the exposed portions of the substrate have been deeply etched.

After cleaning and drying, the patterned substrate 10 is subjected to an anisotropic reactive plasma etching process, shown in FIG. 2A, such as the BOSCH or other similar etch-and-coat technique, wherein the exposed areas 23 of the silicon substrate 10 are etch to a depth d which is substantially greater than the width w of etched channels 25. This step provides the very high aspect ratio etched pattern shown in FIGS. 2B. As noted supra. the BOSCH process is a two step etch-and-coat process wherein the intervening coating step comprises coating the exposed silicon with a thin layer of a polymer film 24 which protects the walls and edges of the etched channel but is quickly destroyed on those surfaces which directly face the bombardment of the reactive plasma 26 shown in FIG. 2A. This action has the effect of etching channels or trenches in the exposed silicon which have a substantially uniform width and substantially parallel walls. The process continues until the desired etch depth d has been achieved. In the case of the present invention the desired depth was 30 microns but any depth, which achieves the stated intent of creating an x-ray blocking mask, is possible.

Figure 3A:
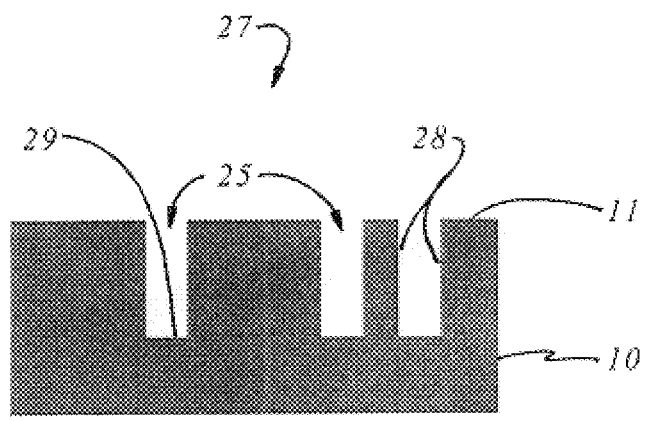
FIG. 3A shows the etched silicon substrate, wherein the remaining photoresist is removed.
Figure 3B:
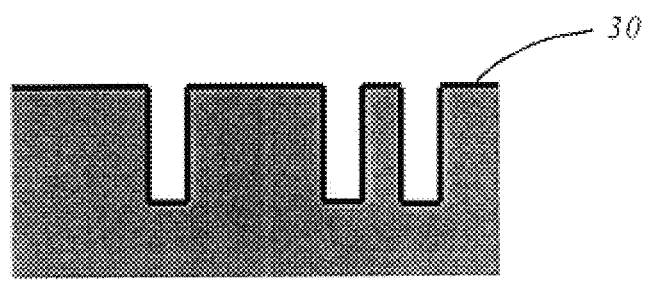
FIG. 3B shows the silicon substrate wherein layers of chromium and of gold are vapor deposited such that the entire top surface of the substrate, those portions which are etched and those which are not, is coated with a thin layer of these metals.

After etching the silicon wafer 10 to the desired depth, the remaining resist layer 22 is removed and the part cleaned leaving substrate 10 with a pattern of etched surfaces 27 across top surface 11 of the wafer. The entire surface is subsequently covered with a thin electrically conductive metal film 30, as shown in FIG. 3B, in preparation for a much heavier coating. The chosen process for applying the first thin coating of FIG. 3B is a thermal evaporation or particle vapor deposition (PVD) process, although any other coating process which would provide a thin, continuous layer of conductive material would be equally effective. However, any such processes must be able to coat both the walls 28 and the bases 29 of the etched channels 25. Such methods could include, but are not limited to, sputtering and chemical vapor deposition or spraying coating methods, and only require that the coating process provide a continuous, adherent, and conductive layer.

As disclosed herein, the film 30 is about a 250 Å (0.025 microns) layer of chromium with an overlaying layer of about 800 Å (0.08 microns) of gold. Any similar metal or combination of metals would be useful including most of the metals in the Transition series of metal listed in New IUPAC Group Numbers 4–12 of the Period Table of elements, alloys thereof, and certain of the metals of Groups 13 and 14, such as aluminum and tin.

Figure 3C:
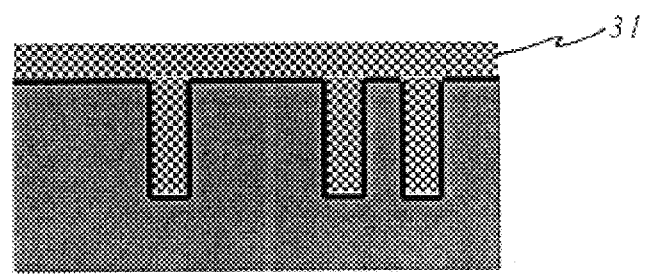
FIG. 3C shows the metal coated silicon substrate having a second thicker layer of gold is deposited such that the etched portions on the substrate are completely filled onto the thin chrome/gold layer of FIG. 3B.

Film 30 is necessary to enable adherence of a final, thicker metal layer 31 which is deposited in a subsequent step, shown in FIG. 3C. In the present invention, layer 31 is also gold but, as before, could be any similar metal selected from the list supplied above, providing that the etch depth d of the mask is adjusted to provide for a sufficiently thick layer of metal to effectively block or substantially attenuate the aforementioned synchrotron flux while remaining below a 100 microns thickness limit known to be about the limit at which silicon is no longer "transparent" to such radiation but will itself begin to attenuate the x-ray beam and thus will begin to degrade to transmission and resolving power of the x-ray mask.

Figure 4:
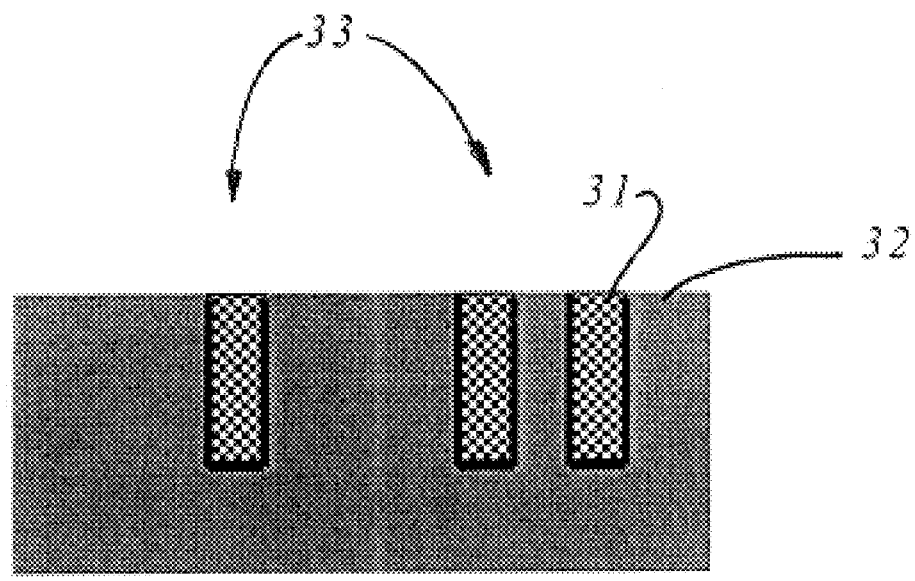
FIG. 4 shows the removal of the excess thick gold layer from the top surface of the silicon substrate by planarizing that surface until the silicon substrate is again exposed.

Following the final step of depositing the thick x-ray blocking layer 31, the mask assembly is planarized, as shown in FIG. 4, to remove metal from across top surface 11 of supporting silicon substrate 10, and to provide a planarized surface 32. Planarizing is typically performed by lapping the top surface until the surface of the silicon is reached leaving only the embedded metal pattern 33 exposed. This is done to remove the "overburden" x-ray blocking metal layer on the top surface of the substrate leaving only the metal deposited in etched channels 25. Planarized surface 32 is also intended to be as flat and smooth as possible since it is the surface which will lay against the surface of the material onto which the synchrotron radiation is to be illuminated.

Figure 5:
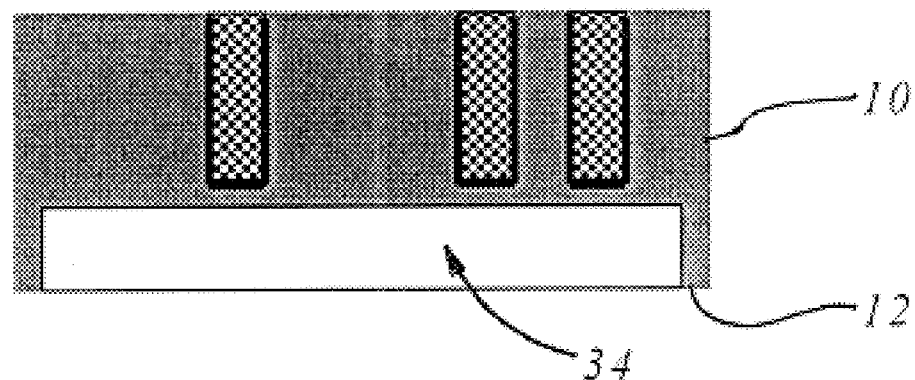
FIG. 5 shows the step in which the back surface across a region beneath the gold pattern is thinned by a blanket etch process until the thickness of the wafer beneath the gold pattern is reduced to less than about 100 microns and thereby providing the final mask embodiment.

A final thinning step, illustrated in FIG. 5, is intended to reduce the thickness of silicon substrate 10 across a region 34 beneath the embedded metal pattern 33. Thinning is performed on the back side 12 of wafer 10 using a standard blanket etching techniques until the thickness of silicon everywhere underneath region 34 of the metal pattern 33 is reduced to about less than 100 microns. As explained above it is known that silicon is transparent or nearly transparent to synchrotron radiation of 10 KeV at thicknesses below about 100 microns.

Finally, because a plurality of metal patterns would be embedded on each silicon wafer, the thinning step is most easily performed by reducing the thickness of the wafer across the entire surface under which such patterns have been created. Doing so however, will inevitably weaken the wafer to the point where it cannot be manually handled. In such cases, unetched areas in the form of struts spanning the diameter of the wafer are allowed to remain as strengthening members.

At this point, the x-ray mask is complete. By implementing these steps, a mask having blocking structures with lateral dimensions of less than 1 micron are achievable. The mask is utilized by placing its planarized surface 32 directly onto the surface of the article which is to be exposed to the synchrotron radiation, and illuminating this assembly with the radiation.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. An x-ray mask tool, comprising:
   a silicon substrate having a thickness, a top surface, and a bottom surfaces substantially parallel to said top surface, said silicon substrate having at least one pattern etched into said top surface, said at least one pattern extending to a depth of at least 10 microns into said thickness and comprising a plurality of etched channels having substantially parallel sides, said etched channels filled with a metal deposit to provide a plurality of metal structures embedded into said silicon substrate extending to said depth and flush with said top surface, said metal structures comprising features having lateral dimensions of less than 1 micron.

2. The x-ray mask tool of claim 1, wherein said metal deposit is any metal capable of attenuating x-ray radiation to an energy of below about 0.1 KeV in a distance of less than about 100 microns.

3. The x-ray mask tool of claim 1, wherein said metal deposit is a metal selected from the group consisting of the Transition series of metals listed in New IUPAC Group Numbers 4–12 of the Period Table of elements, aluminum, tin, and alloys thereof.

4. The x-ray mask tool of claim 1, wherein said metal deposit consists essentially of gold.

5. The x-ray mask tool of claim 3, wherein said metal deposit comprises a thin vapor deposited first metal layer.

6. The x-ray mask tool of claim 5, wherein said vapor deposited first metal layer comprises a first layer of chromium.

7. The x-ray mask tool of claim 5, wherein said metal deposit is deposited by electroplating.

8. The x-ray mask tool of claim 5, wherein said metal deposit is deposited by electroless deposition.

9. The x-ray mask tool of claim 5, wherein said metal deposit is deposited by thermal or particle vapor deposition.

10. The x-ray mask tool of claim 5, wherein said metal deposit is deposited by sputter deposition.

11. The x-ray mask tool of claim 5, wherein said metal deposit is deposited by molecular beam epitaxy.

12. The x-ray mask tool of claim 1, wherein said silicon substrate is thinned from said bottom surface to a thickness of less than 100 microns across a zone encompassing said pattern.

* * * * *